(12) United States Patent
Kubena et al.

(10) Patent No.: US 7,237,315 B2
(45) Date of Patent: Jul. 3, 2007

(54) METHOD FOR FABRICATING A RESONATOR

(75) Inventors: Randall L. Kubena, Oak Park, CA (US); David T. Chang, Calabasas, CA (US); Jinsoo Kim, Avondale, PA (US)

(73) Assignee: HRL Laboratories, LLC, Malibu, CA (US)

( * ) Notice: Subject to any disclaimer, the term of this patent is extended or adjusted under 35 U.S.C. 154(b) by 124 days.

(21) Appl. No.: 10/426,931

(22) Filed: Apr. 30, 2003

(65) Prior Publication Data

US 2004/0211052 A1 Oct. 28, 2004

Related U.S. Application Data

(60) Provisional application No. 60/376,995, filed on Apr. 30, 2002.

(51) Int. Cl.
*H04R 31/00* (2006.01)
(52) U.S. Cl. ............... 29/594; 29/25.35; 29/609.1; 181/171; 181/172; 216/62; 216/63; 216/66; 310/321; 310/328; 310/330; 310/331; 381/396; 381/398; 451/5; 451/41; 438/48; 438/459
(58) Field of Classification Search ........... 29/25.35, 29/594, 609.1; 181/171, 172; 216/62, 63, 216/66; 310/321, 328, 330, 331; 381/396, 381/398; 451/5, 41; 438/48, 459
See application file for complete search history.

(56) References Cited

U.S. PATENT DOCUMENTS 3,766,616 A  10/1973 Staudte .................. 29/25.35

4,364,016 A  * 12/1982 Tanski ..................... 333/193

(Continued)

FOREIGN PATENT DOCUMENTS

EP  0 531 985 A1  3/1993

(Continued)

OTHER PUBLICATIONS

"Properties of SAW resonators fabricated on quartz substrates of various qualities"; Greer, J.A.; Parker, T.E.; Montress, G.K.; Ultrasonics Symposium, 1994, Proceedings., 1994 IEEE, vol. 1, Nov. 1-4, 1994; pp. 31-36 vol. 1.*

(Continued)

*Primary Examiner*—Paul Kim
(74) *Attorney, Agent, or Firm*—Ladas & Parry

(57) ABSTRACT

A method for fabricating a quartz nanoresonator which can be integrated on a substrate, along with other electronics is disclosed. In this method a quartz substrate is bonded to a base substrate. The quartz substrate is metallized so that a bias voltage is applied to the resonator, thereby causing the quartz substrate to resonate at resonant frequency greater than 100 MHz. The quartz substrate can then be used to drive other electrical elements with a frequency equal to its resonant frequency. The quartz substrate also contains tuning pads to adjust the resonant frequency of the resonator. Additionally, a method for accurately thinning a quartz substrate of the resonator is provided. The method allows the thickness of the quartz substrate to be monitored while the quartz substrate is simultaneously thinned.

14 Claims, 6 Drawing Sheets

U.S. PATENT DOCUMENTS

| | | | |
|---|---|---|---|
| 4,442,574 A | * 4/1984 | Wanuga et al. | 29/25.35 |
| 5,260,596 A | 11/1993 | Dunn et al. | 257/414 |
| 5,605,490 A | 2/1997 | Laffey et al. | 451/36 |
| 5,666,706 A | 9/1997 | Tomita et al. | 29/25.35 |

FOREIGN PATENT DOCUMENTS

| | | |
|---|---|---|
| JP | 57-091017 | 6/1982 |
| JP | 04322507 A | * 11/1992 |
| JP | 08330878 A | * 12/1996 |

OTHER PUBLICATIONS

Abe, Takashi, et al., "One-chip multichannel quartz crystal microbalance (QCM) fabricated by Deep RIE," *Sensors and Actuators*, vol. 82, pp. 139-143 (2000).

Cleland, A.N., et al., "Fabrication of high frequency nanometer scale mechanical resonators from bulk Si crystals," *Appl. Phys. Lett.*, vol. 69, No. 18, pp. 2653-2655 (Oct. 28, 1996).

Evoy, S., et al., "Temperature-dependent internal friction in silicon nanoelectromechanical systems," *Applied Physics Letters*, vol. 77, No. 15, pp. 2397-2399 (Oct. 9, 2000).

* cited by examiner

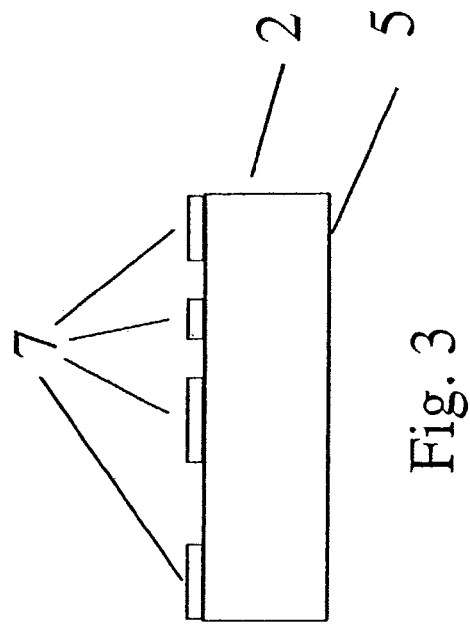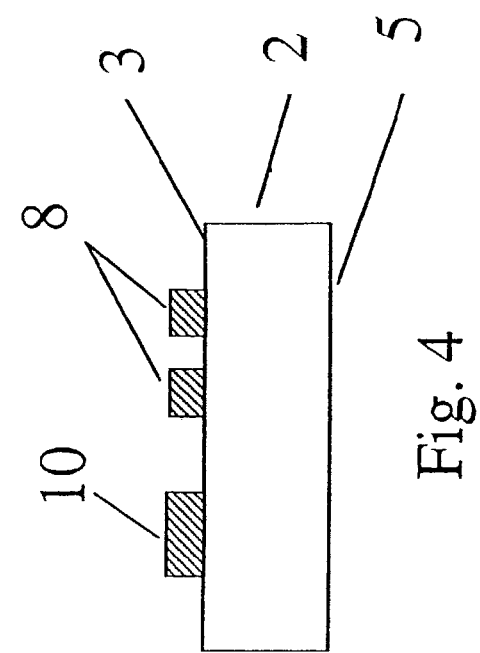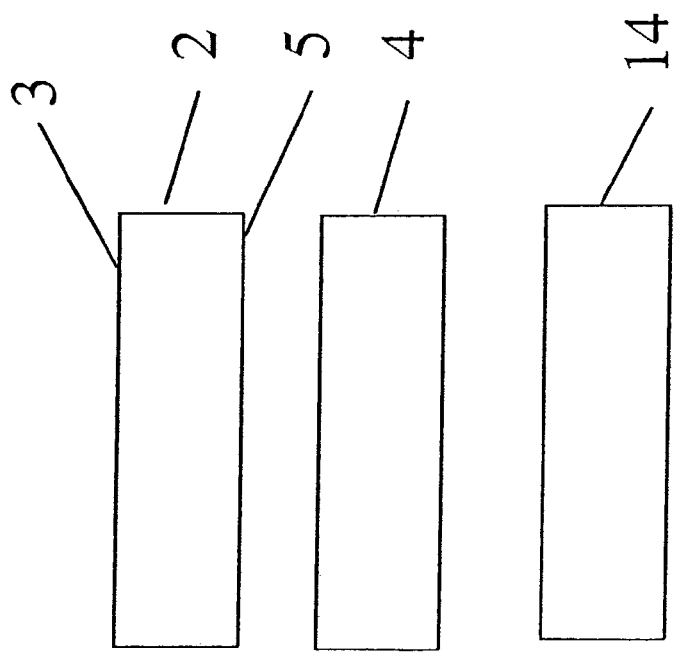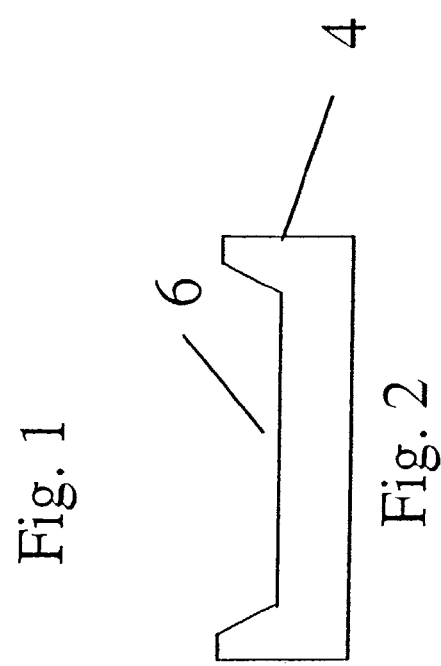

METHOD FOR FABRICATING A RESONATOR

CROSS-REFERENCE TO RELATED APPLICATIONS

The present document claims the benefit of U.S. Provisional Application No. 60/376,995, filed Apr. 30, 2002, the contents of which are incorporated by reference herein. The present invention was made under government contract with the Defense Advanced Research Projects Agency (DARPA), NMASP program, contract number DAAB07-02-C-P613.

FIELD

The present invention relates to a method and apparatus for making a resonator. More specifically, the present invention relates to a method for fabricating nanoresonators using a quartz substrate integrated with a base substrate, and a method for thinning the quartz substrate.

BACKGROUND

The use of quartz substrates in a MEMS process provides for the fabrication of high Q, thermally compensated resonators. For thickness shear mode resonators, the thickness of the substrate determines its resonant frequency. The thinner the quartz substrate, the higher the resonant frequency. Therefore, by varying the dimensions of the substrate over a broad range, the resonant frequency can be adjusted over a broad range. The Q of a resonator is a measure of the frequency selectivity of a resonator and is related to how well the energy of the oscillations are trapped. One factor that influences how well the energy of the oscillations is trapped is the smoothness of the surface. When thinning a quartz substrate it is desirable to maintain a smooth undamaged surface to ensure a high Q. However, present quartz fabrication techniques for oscillators or filters do not allow the resonators to be integrated on a chip with other electronics. This is a significant contributing factor to the size and cost of a device. Using separate on chip components also contributes significantly to the size and cost of a device.

Furthermore, present quartz thinning processes have not been able to thin substrates to a thickness on the order of 10 micrometers or less, because of the inability to monitor the thickness of the quartz substrate in real time with sub micron resolution. Another difficulty is the handling of the quartz substrate after it has been thinned. One reference which discusses thinning quartz substrates is Takahsi Abe, Masayoshi, "One-Chip Multichannel Quartz crystal microbalance (QCM) Fabricated By Deep RIE," Sensors and Actuators, 2000, pp. 139–143. Having a quartz substrate with a thickness on the order of 10 microns or less can result in resonant frequencies greater than 100 MHz, which is desirable for high frequency applications. By combining several quartz based resonators having different resonant frequency, with a RF MEMS switch on the same chip, frequency hopping and filter reconfiguration can occur on the microsecond time scale. In frequency hopping and filter reconfiguration the desired frequency in a band of frequencies is selected by using the RF MEMS switch to activate the quartz resonator having a resonant frequency equal to the desired frequency. The spectral band for most radio frequency hopping and filter reconfiguration applications is 20 MHz to 3 GHz. The low frequency part of the band is extremely difficult to cover with conventional capacitive-based filters since capacitive-based filters are larger in size. Frequency hopping and filter reconfiguration applications would also benefit from temperature compensated, stable, high-Q (in the amount of about 10,000), small arrays of resonators which cover that spectral band.

MEMS devices which consist of silicon-based nanoresonators have been fabricated in an attempt to integrate nanoresonators or microresonators with other electronics. Nanoresonators and microresonators are resonators which have linear dimensions on the order of nanometers and micrometers, respectively. These silicon-based nanoresonators have shown resonant frequencies as high as 600 MHz, and Q's in the range of 1000–2000. However, the problem with silicon-based nanoresonators is that they have high electrical impedances and lower Q's. Two documents which discuss silicon-based nanoresonators are S. Evoy, A. Olkhovets, L. Sekaric, J. M. Parpia, H. G. Craighead, D. W. Carr, "Temperature-dependent Internal Friction in Silicon Nanoelectromechanical Systems," Applied Physics Letters, Vol. 77, Number 15, and A. N. Cleland, M. L. Roukes, "Fabrication of High Frequency Nanometer Scale Mechanical Resonators From Bulk Si Crystals," Applied Physics Letters, Oct. 28, 1996.

An alternative solution, is known which makes use of non-MEMS quartz resonators. Such resonators consist of shear strip individual resonators operating in ranges of about 10 MHz to about 1 GHz. These resonators are packaged as discrete devices and mounted as hybrids to other RF circuits. The problem with non-MEMS quartz resonators is that they are non-integrable, they have higher costs, and they are physically larger in size.

As a result, a new process for manufacturing a quartz-based nanoresonator is desired in order to solve all the aforementioned problems.

SUMMARY

The present invention describes a method and apparatus for fabricating and integrating quartz-based resonators on a high speed substrate for integrated signal processing by utilizing a combination of novel bonding and etching steps to form ultra thin quartz based resonators. Thinning the quartz substrate in the quartz resonator can be used to provide the desired resonant frequency and may be in excess of 100 MHz.

According to one aspect of the present invention, a novel method for fabricating a quartz based resonator is disclosed. The method makes use of the bond between the quartz substrate and the silicon substrate, as well as a novel process to thin the quartz substrate to a desired thickness. A quartz substrate is provided having a first electrode deposited thereon. The quartz substrate is bonded to a first substrate having a cavity etched therein to accommodate the first electrode. The quartz substrate is then thinned to a desired thickness and a second electrode is deposited on the quartz substrate. The first electrode is connected to the second electrode with vias which are filled with a metal. In addition to the first and second electrodes, a tuning pad is preferably deposited on the quartz substrate. Further, the present invention provides a base substrate which contains probe pads. After depositing the first and second electrodes and the tuning pads on the quartz substrate, the probe pads of the base substrate are bonded to the second electrodes of the quartz substrate. The tuning pad can be used to adjust the resonant frequency of the quartz substrate. Further, it is also possible to use the first and second electrodes as tuning pads. More specifically, the first and second electrodes may be ablated to adjust the resonant frequency of the nanoresonator. Additionally, the base wafer could contain high-speed RF electronics, which would suppress the need for lengthy bond wires. The first substrate is then removed from the quartz substrate thereby releasing the resonator.

It is also an object of the present invention to provide a method for fabricating a quartz based resonator without the use of a silicon wafer. In this embodiment first electrodes and a tuning pad are deposited on the quartz resonator. A base substrate is also provided. The base substrate contains probe pads for providing an electrical connection to the quartz substrate. The quartz substrate is bonded to the base substrate and then undergoes a thinning process. After the quartz substrate is thinned, second electrodes and a tuning pad are deposited on the quartz substrate.

It is also an object of the present invention to provide a novel method for thinning a quartz substrate. In this method, a lap and polish system is used to remove a substantial portion of the quartz substrate. Then reactive ion etching is used thin the quartz substrate to a thickness less than 10 micrometers, which is needed for resonant frequencies greater than 100 MHz. The reactive ion etching is used simultaneously with an optical monitoring technique to obtain the current thickness of the quartz substrate as it is being thinned. After obtaining the desired thickness of the quartz substrate using reactive ion etching, the quartz substrate can be further polished using a chemical mechanical polish (CMP) or a wet etch.

BRIEF DESCRIPTION OF DRAWINGS

The present invention will be understood and appreciated more fully from the following detailed description taken in conjunction with the drawings in which:

FIG. 1 shows a quartz substrate, silicon substrate and base substrate, to be used in accordance with a first embodiment of the present invention;

FIG. 2 shows the silicon substrate with a cavity;

FIG. 3 shows photoresist on the quartz substrate;

FIG. 4 shows the quartz substrate with first electrodes and a tuning pad;

DETAILED DESCRIPTION OF PREFERRED EMBODIMENTS

Figure 5D:
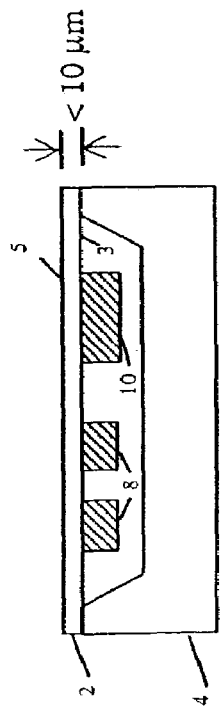
FIGS. 5b–5e show the thinning of the quartz substrate while bonded to the silicon substrate.

The present invention provides a method and apparatus for fabricating a resonator with reference to FIGS. 1–22.

First Embodiment

A method of fabricating a quartz resonator according to a first embodiment of the present invention will now be described with reference to FIGS. 1–13. Referring to FIG. 1, a quartz substrate 2 having a first surface 3 and a second surface 5, a first substrate 4, and a base substrate 14 are provided. The first substrate 4 may comprise a material such as silicon or GaAs. In this embodiment, both the first substrate 4 and quartz substrate 2 may be provided in the form of 3 inch or larger wafers. A portion of the first substrate 4 is etched away creating a cavity 6, as shown in FIG. 2. The etched cavity 6 can be fabricated with a wet etch of potassium hydroxide, or a dry reactive ion etch using a gas having a fluorine chemistry.

The first surface 3 of the quartz substrate 2 is then patterned and metallized using a lift-off technique. In the lift-off technique, a thin layer of photoresist 7 is patterned on the first surface 3 of the quartz substrate 2, as shown in FIG. 3. Using lithography, photoresist is removed in the regions where metallization is desired. The metal is then deposited on the photoresist 7 and in the regions where the photoresist 7 was removed. The photoresist is then removed leaving metal only in the desired regions on the first surface 3 of the quartz substrate 2 as shown in FIG. 4. During patterning and metallizing at least one first electrode 8 is deposited on the first surface 3 of the quartz substrate 2. The first electrode 8 may be comprised of a combination of Ti, Pt, Au, or Cr, Pt, Au, deposited in that order on the first surface 3 of the quartz substrate 2 in that order. Shown in FIG. 4 are two first electrodes 8 on the first surface 3 of the quartz substrate 2. Additionally, a first tuning pad 10 may be deposited on the first surface 3 of the quartz substrate 2. The first tuning pad 10 is comprised of the same material as the first electrodes 8. The purpose of the two first electrodes 8 and the first tuning pad 10 will be discussed later.

Figure 5E:
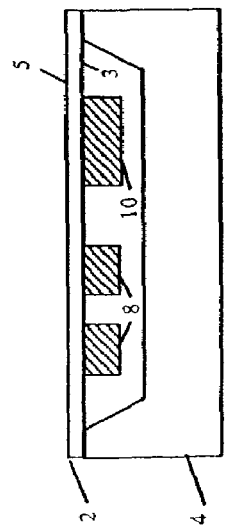
Figure 5A:
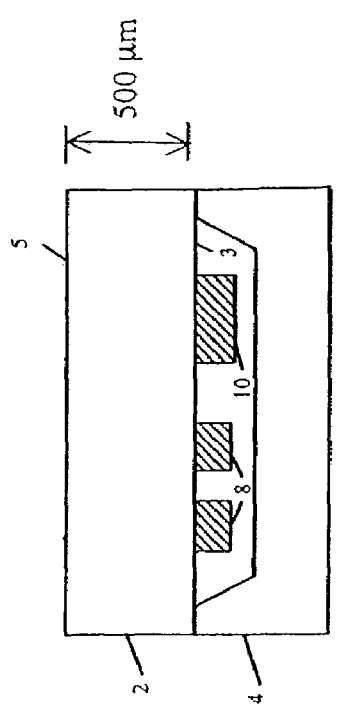
FIG. 5a shows the quartz substrate bonded to the silicon substrate.

After the first electrodes 8 and the first tuning pad 10 are deposited, the quartz substrate 2 is bonded to the etched first substrate 4, as shown in FIG. 5a using for example, an EV 501 Wafer Bonder which is commercially available. To bond the quartz substrate 2 to the first substrate 4, the quartz substrate 2 and first substrate 4 are thoroughly cleaned in a megasonic cleaning system, which makes use of ultrasonic waves to remove particle contaminants. After the wafers are cleaned, they are brought in contact with each other. The contact between the quartz substrate 2 and the first substrate 4 creates a bond due to the well known van der Waals force.

The first electrodes 8 and the first tuning pad 10 are now located in the cavity 6 of the first substrate 4.

Figure 5B:
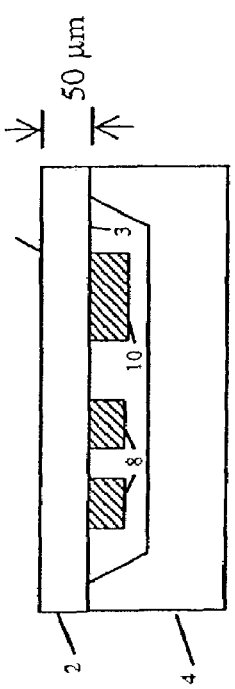

The second surface 5 of the quartz substrate 2 remains exposed, and undergoes a thinning process, shown in FIGS. 5b–5e. In order to thin the quartz substrate 2, the following method is used. For exemplary purposes only, the quartz substrate 2 has an initial thickness of 500 micrometers. A first portion of the quartz substrate 2 is removed by thinning the quartz substrate from about 500 micrometers to 50 micrometers as shown in FIG. 5b using a mechanical lapping and polishing system. Lapping and polishing systems are well known and commercially available from manufacturers such as Logitech. In a mechanical lapping and polishing system, a polishing head is spun at a high rate of speed. The lapping and polishing system also comprises a nozzle for dispensing slurry on the quartz substrate 2. While spinning, the polishing head contacts the quartz substrate in the presence of the slurry, thereby evenly grinding away portions of the quartz substrate 2. The slurry may be comprised of chemicals such as aluminum oxide to remove quartz from the quartz substrate 2.

Figure 5C:
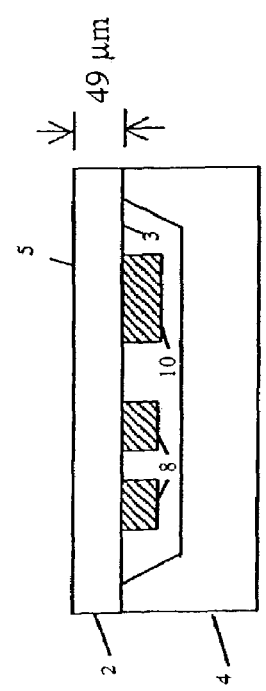

Next, a second portion of about 1 micrometer of quartz is removed from the quartz substrate 2, as shown in FIG. 5c to ensure a smooth surface. This is done with the above described mechanical lapping and polishing system, except a softer chemical such as colloidal silica or cerium oxide is used in the slurry to remove quartz from the quartz substrate 2.

Figure 6A:
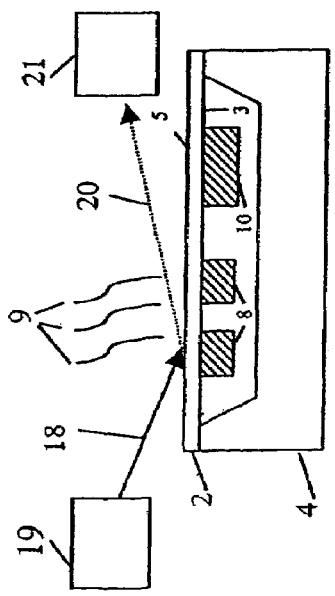
FIGS. 6a and 6b show two methods used to monitor the thickness of the quartz substrate while being thinned.
Figure 6B:
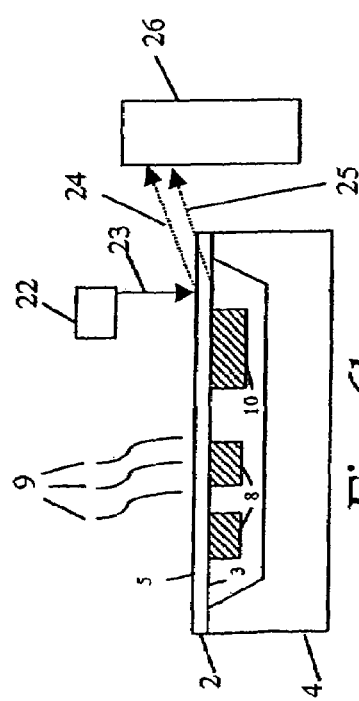

Next, a third portion of the quartz substrate 2 is removed to reduce the thickness of the quartz substrate 2 to less than 10 micrometers as shown in FIG. 5d using reactive ion etching (RIE) with $CF_4$ or $SF_6$ gas 9, as shown in FIGS. 6a–6b. While being thinned in the RIE machine, the thickness of quartz substrate 2 is simultaneously monitored using spectropic ellipsometry or reflectometry techniques, as shown in FIGS. 6a–6b. In spectroscopic ellipsometry, shown in FIG. 6a, a beam of white light 18 from a source 19 is shone onto the quartz substrate 2 at an angle of about 15° off horizontal. The white light has a known polarization. The reflected white light 20 off the quartz substrate 2 will have a different polarization which is directly related to the thickness of the quartz substrate 2. A receiver 21 receives the reflected white light 20 and calculates the change in polarization. The change in polarization is directly proportional to the thickness of the quartz substrate 2. In reflectometry, shown in FIG. 6b, a laser source 22 shines light 23, with a known wavelength, onto the second surface 5 of the quartz substrate 2 at an angle of 90° off horizontal as shown in FIG. 6b. A first reflected beam 24 is reflected off the second surface 5 of the quartz substrate 2. A portion of the incident light also penetrates through the quartz substrate 2. This creates a second reflected beam 25 which is reflected off the first surface 3 back through the quartz substrate 2 and out the second surface 5. The first reflected beam 24 and second reflected beam 25 are parallel to each other and are received by a receiver 26 which determines whether the first reflected beam 24 and the second reflected beam 25 add constructively or destructively. If the first and second reflected beams 24, 25 add constructively, the thickness of the quartz substrate is equal to 25% of the ratio of the incident light wavelength divided by the refractive index of quartz, or an odd integer multiple thereof, such as 75%, 125%, etc. The refractive index of quartz is typically about 1.46. If the first and second reflected beams 24, 25 add destructively, the thickness of the quartz substrate 2 is equal to 50% of the ratio of the incident light wavelength divided by the refractive index of quartz, or an integer multiple thereof, such as 100%, 150%, etc.

After using RIE to remove quartz from the quartz substrate 2, the surface of the quartz substrate 2 may have imperfections that need to be corrected. This can done by using the mechanical lapping and polishing system described above with a chemical such as silica or cerium oxide, to remove about 0.01–0.02 micrometers of quartz, followed up with a wet etch in ammonium bifluoride to remove about 0.005 micrometers of quartz from the quartz substrate 2, as shown in FIG. 5e. This additional step will help ensure a polished, defect free quartz substrate 2.

Figure 7:
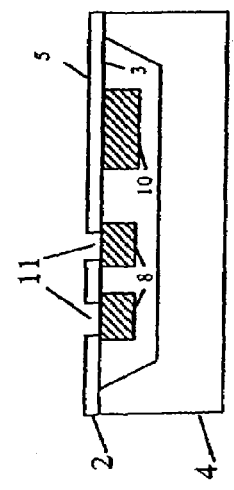
FIG. 7 shows vias in the quartz substrate.
Figure 8:
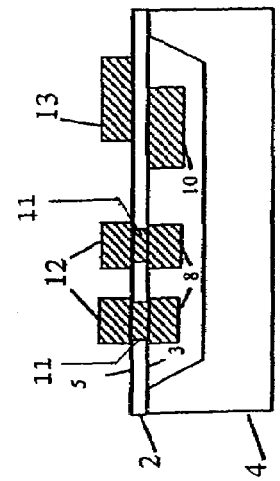
FIG. 8 shows the same as FIG. 7 except second electrodes and a tuning pad have been deposited on the quartz substrate.

After the quartz substrate 2 is thinned, vias 11 are fabricated in the quartz substrate 2, as shown in FIG. 7. The vias 11 are created using lithography techniques well known in the art. The vias 11 are contacts which are etched through the quartz substrate 2 to the first electrodes 8. FIG. 7 shows two vias 11. Once the vias 11 are fabricated, the vias are metallized and the second surface 5 of the quartz substrate 2 is patterned and metallized, as shown in FIG. 8, using the lift-off technique described for depositing the at least one first electrode 8. During the metallization step, at least one second electrode 12 is deposited on the second surface 5 over the vias 11. The second electrode 12 may be comprised of a combination of Ti, Pt, Au, or Cr, Pt, Au, deposited in that order on the second surface 5 of the quartz substrate 2 in that order. Shown in FIG. 8 are two second electrodes 12.

Figure 9:
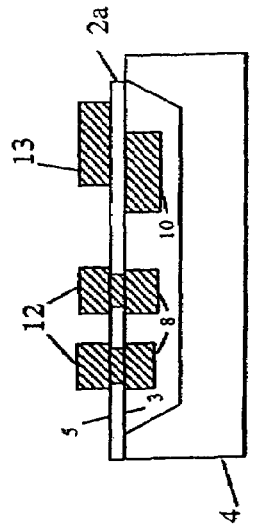
FIG. 9 shows the same as FIG. 8 except a portion of the quartz substrate has been removed.

The first and second electrodes 8, 12 are now connected through the vias 11. Additionally, a second tuning pad 13 can be deposited during the step of depositing the second electrodes 12, as shown in FIG. 8. The second tuning pad 13 is comprised of the same material as the second electrodes 12. Once the first and second electrodes 8, 12 and first and second tuning pads 10, 13 have been deposited, a portion of the quartz substrate 2 is removed, thereby creating a modified quartz substrate 2a, as shown in FIG. 9. Such portion is removed using lithography and REI techniques well known in the art to divide the quartz substrate into individual devices and determine the desired dimensions of the quartz substrate 2.

The first and second tuning pads 10, 13 on the modified quartz substrate 2a allow the resonant frequency of the quartz substrate 2a to be adjusted. By ablating a portion of the first and second tuning pads 10, 13, the resonant frequency of the quartz substrate 2a can be adjusted. However, it is also possible to adjust the resonant frequency by ablating a portion of the first and second electrodes 8, 12. The first and second tuning pads 10, 13 can be ablated using known techniques such as focused ion beam milling or laser ablation.

Figure 10:
FIG. 10 shows a portion of the base substrate having been removed.
Figure 11:
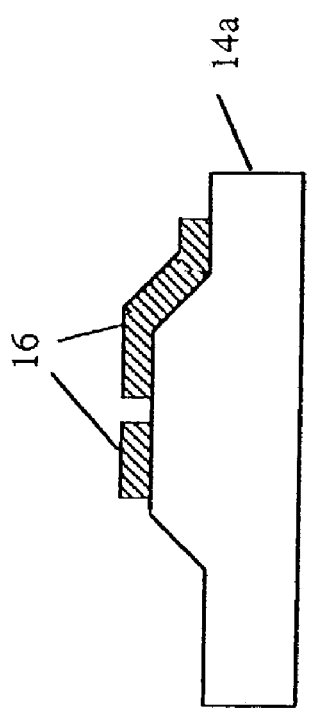
FIG. 11 shows the same as FIG. 10 except probe pads have been added to the base substrate.

As already mentioned above with reference to the detailed description of FIG. 1, a base substrate 14 is provided. The base substrate 14 is comprised of a group III–V material or SiGe. FIG. 10 shows a modified base substrate 14a, where a portion of the base substrate 14 shown in FIG. 1 has been removed. The removal of a portion of the base substrate 14 is done using lithography techniques well known in the art. At least one probe pad 16 is deposited on the modified base substrate 14a. FIG. 11 shows, for example, two probe pads 16. The probe pads are deposited using the same lift off technique used to deposit the at least one first electrode 8 discussed previously. The probe pads 16 may be comprised of a gold/germanium alloy, nickel, and gold deposited in that order.

Figure 12:
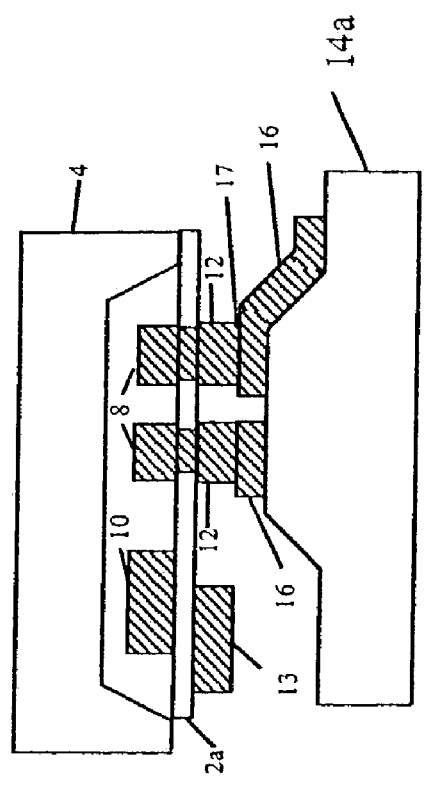
FIG. 12 shows the bond between the probe pads of the base substrate and the second electrodes on the quartz substrate.
Figure 16:
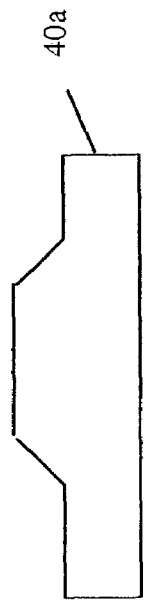
FIG. 16 shows a portion of the base substrate having been removed.

After the probe pads 16 have been deposited on the modified base substrate 14a, the bottom electrodes 12 of the modified quartz substrate 2a are bonded to the probe pads 16 along bonding line 17, as shown in FIG. 12 using an Au—Au compression bonding scheme. In the Au—Au compression bonding scheme, the quartz substrate 2, the second electrodes 12, the probe pads 16, and the modified base substrate 14a are heated to a temperature greater than 300° C. in a vacuum having a pressure no greater than $10^{-4}$ Torr. Then the second electrodes 12 and probe pads 16 are pressed together, while depressurized, with a pressure of approximately 1 MPa. This will fuse the probe pads 16 and the second electrodes 12 together, as shown in FIG. 12.

Figure 13:
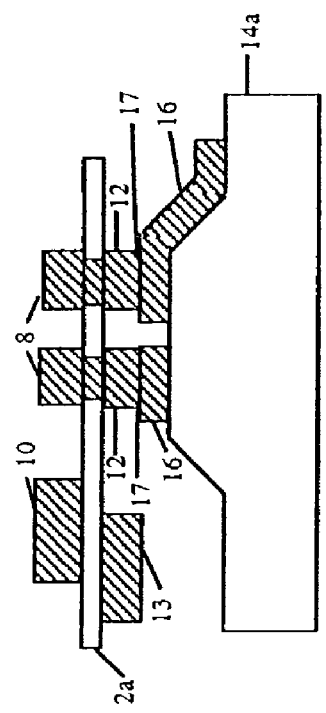
FIG. 13 shows the same as FIG. 12 except the silicon substrate has been removed.

The above described bonded structure provides electrical access from the probe pads 16 to the first electrodes 8. After the second electrodes 12 have been bonded to the probe pads 16, the quartz substrate 2a is removed from the remaining structure, using a combination of wet and dry etches so that a structure like the one shown in FIG. 13 is obtained.

The purpose of the first and second electrodes 8, 12 is to receive an electrical signal from the probe pads 16 which can bias or drive the modified quartz substrate 2a with an electric field. The electrical signal is preferably an AC signal. When the electrical signal is received by the first and second electrodes 8, 12 a strain is placed on the modified quartz substrate 2a. This strain stimulates the mechanical resonant frequency of the modified quartz substrate 2a by the well-known piezoelectric effect, thereby causing the modified quartz substrate 2a to oscillate at its resonant frequency. Additionally, it is also possible to use the first and second electrodes 8, 12 to sense the movement of the modified quartz substrate 2a relative to a specified plane (not shown). Once the modified quartz substrate 2a is oscillating at its resonant frequency, it can be used to drive other components at a frequency equal to its resonant frequency.

Second Embodiment

Figure 14:
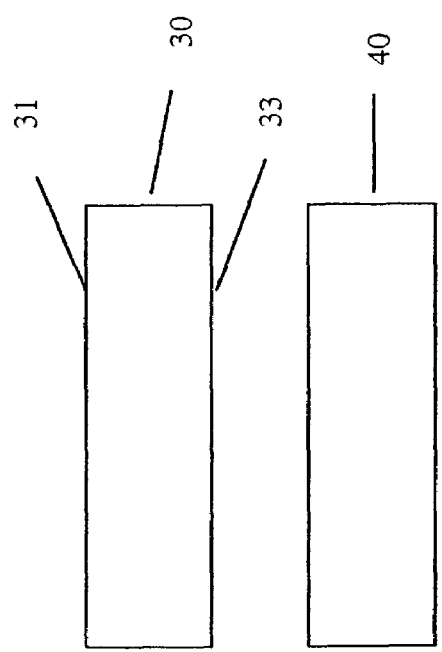
FIG. 14 shows the quartz substrate and base substrate to be used in accordance with a second embodiment of the present invention.
Figure 15:
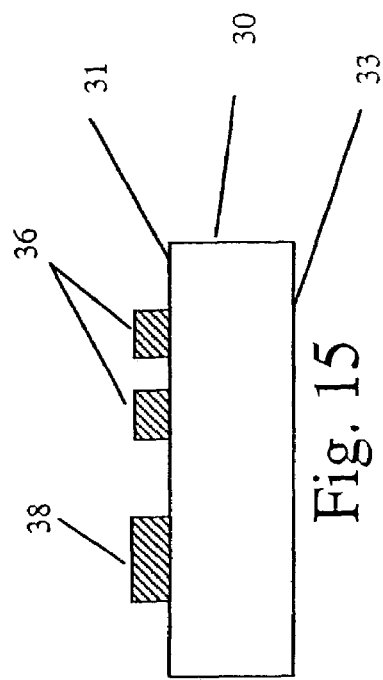
FIG. 15 shows the quartz substrate with first electrodes and a tuning pad.

A second embodiment of a method for fabricating a quartz resonator will now be described with reference to FIGS. 14–22. This second embodiment is similar to the first embodiment, except the first substrate is removed from the process. In this embodiment, a quartz substrate 30 and a base substrate 40 are provided, as shown in FIG. 14. A first surface 31 of the quartz substrate 30 is patterned and metallized using the lift-off technique discussed in the first embodiment for depositing first electrodes 8. During patterning and metallizing, at least one first electrode 36 is deposited on the first surface 31 of the quartz substrate 30. FIG. 15 shows two first electrodes 36. Additionally, a first tuning pad 38 is deposited on the first surface 31 of the quartz substrate 30.

Figure 17:
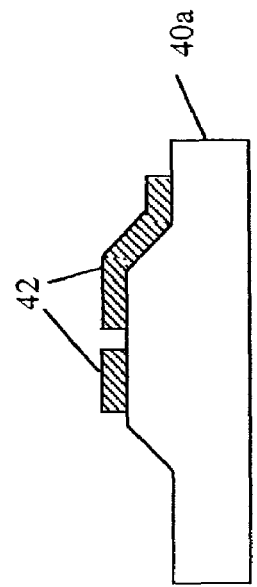
FIG. 17 shows the same as FIG. 16 except probe pads have been added to the base substrate.

As aforementioned, a base substrate 40 is provided. This base substrate 40 is comprised of a group III–V material or SiGe. In order to obtain a modified base structure 40a, shown in FIG. 16, a portion of the base structure 40 is removed using the techniques discussed in the first embodiment. At least one probe pad 42 is deposited on the modified base substrate 40a using the lift-off technique discussed in the first embodiment for depositing probe pads 16. Shown in FIG. 17 are two probe pads 42.

Figure 18:
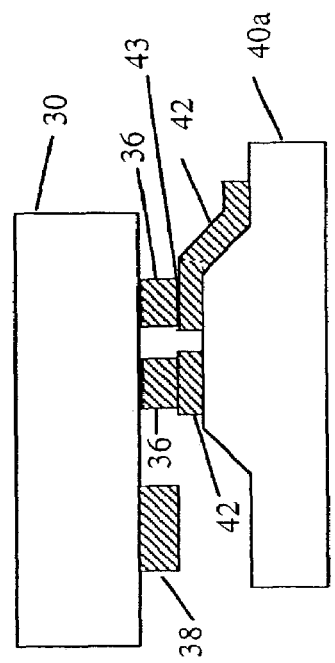
FIG. 18 shows the quartz substrate bonded to the base substrate.

After the probe pads 42 have been deposited on the modified base substrate 40a, the first electrodes 36 of the quartz substrate 30 are bonded to the probe pads 42 along bonding line 43, as shown in FIG. 18 using the Au—Au bonding scheme discussed in the first embodiment.

Figure 19:
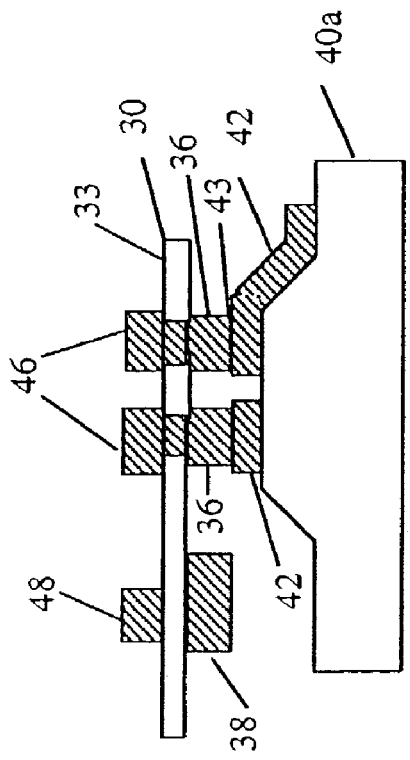
FIG. 19 shows the thinning of the quartz substrate while bonded to the base substrate.
Figure 21:
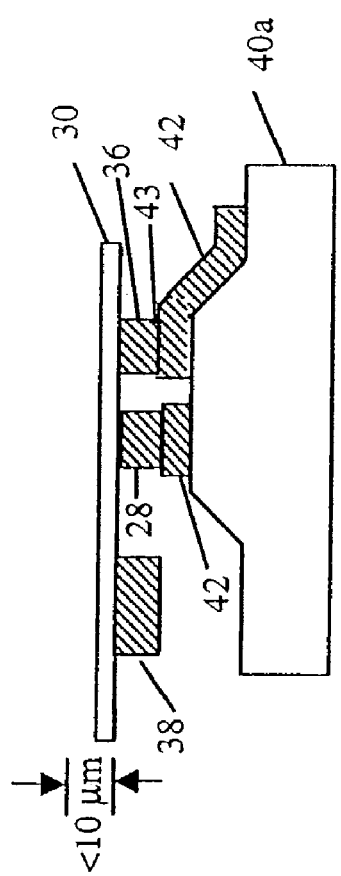
FIG. 21 shows the second electrodes and tuning pad on the quartz substrate.
Figure 20:
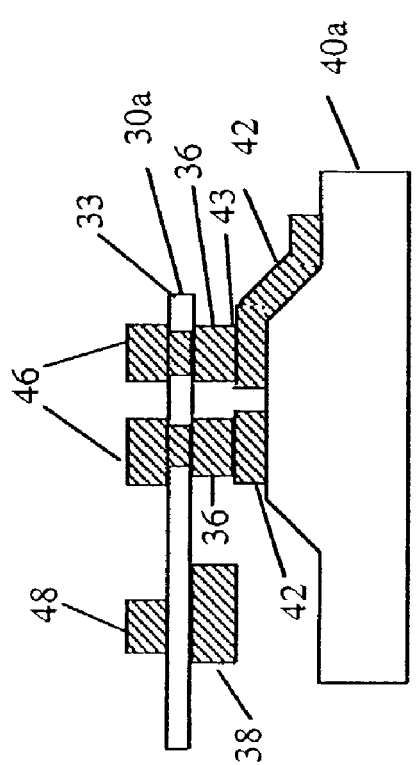
FIG. 20 shows the vias created in the quartz substrate.
Figure 22:
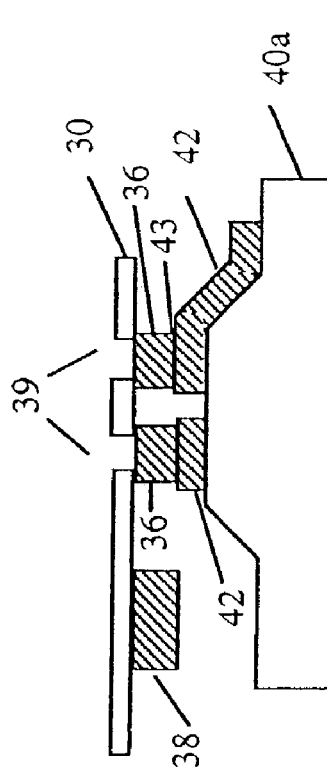
FIG. 22 shows the same as FIG. 21 except a portion of the quartz substrate removed.

Next, the quartz substrate 30 is thinned to a thickness of 10 micrometers or less, as shown in FIG. 19, using the technique discussed in the first embodiment. Vias 39 are fabricated in the quartz substrate 30 using the techniques discussed in the first embodiment. The vias 39, shown in FIG. 20, are contacts which are etched through the quartz substrate 30 to the first electrodes 36. Once the vias 39 are fabricated, the vias 39 are metallized and the second surface 33 of the quartz substrate 30 is patterned and metallized using the lift-off technique discussed in the first embodiment for depositing second electrodes 12. During the metallization step, at least one second electrode 46 is deposited on the second surface 33 over the vias 39. Shown in FIG. 21 are two second electrodes 46. The first and second electrodes 36, 46 are connected through the vias 39. Furthermore, a second tuning pad 48 can be deposited as shown in FIG. 21, during patterning and metallization of the second electrodes 46. Finally a portion of the quartz substrate 30 is removed, thereby creating a modified quartz substrate 30a, as shown in FIG. 22, using lithography and RIE techniques known in the art. Once the modified quartz substrate 30a is oscillating at its resonant frequency, it can be used to drive other components at a frequency equal to its resonant frequency.

Let it be understood that the foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. A method for fabricating a resonator comprising:
   providing a first substrate having a cavity etched therein;
   providing a quartz substrate;
   bonding the quartz substrate over the cavity;
   thinning the quartz substrate;
   removing a portion of the bonded quartz substrate to expose a portion of the first substrate;
   bonding the quartz substrate to a base substrate; and
   removing the first substrate, thereby releasing the quartz substrate.

2. The method of claim 1, wherein the step of thinning comprises thinning the quartz substrate to a thickness of less than ten micrometers.

3. The method of claim 1, wherein the first substrate is comprised of a member selected from the group consisting of Si and GaAs.

4. The method of claim 1, wherein the step of providing a base substrate further comprises the step of:
   removing a portion of the base substrate thus obtaining a modified base substrate; and
   depositing at least one probe pad on the modified base substrate.

5. The method of claim 4, wherein the quartz substrate comprises a first surface and a second surface, the quartz substrate further comprising at least one first electrode on the first surface, and at least one second electrode on the second surface of the quartz substrate.

6. The method of claim 5, wherein the quartz substrate further comprises at least one via connected to the at least one first electrode and the at least one second electrode, wherein the at least one via is filled with a metal.

7. The method of claim 6, wherein the quartz substrate further comprises at least one tuning pad for tuning the quartz substrate to a desired resonant frequency.

8. The method of claim 7, wherein the step of bonding the quartz substrate to the base substrate, comprises the step of bonding the at least one probe pad to the at least one second electrode, thereby allowing a signal to flow between the at least one probe pad and the at least one second electrode.

9. The method of claim 7, wherein the at least one tuning pad is ablated to adjust the resonant frequency of the resonator.

10. The method of claim 7, wherein the tuning pad is one among the at least one first electrode and the at least one second electrode.

11. The method of claim 1, wherein the base substrate is comprised of a member selected from the group consisting of group III–V materials and SiGe.

12. A method for fabricating a resonator comprising:
providing a first substrate having a cavity etched therein;
providing a quartz substrate;
bonding the quartz substrate over the cavity;
thinning the quartz substrate;
forming at least one metallized via in the quartz substrate;
providing a base substrate;
bonding the quartz substrate to the base substrate; and
removing the first substrate, thereby releasing the quartz substrate.

13. The method of claim 12, wherein the quartz substrate comprises a first surface and a second surface, said method further including: forming at least one first electrode on the first surface of the quartz substrate and forming at least one second electrode on the second surface of the quartz substrate, the at least one first electrode and the at least one second electrode being in electrical contact with each other through said at least one via.

14. The method of claim 13, wherein the at least one first electrode and the at least one second electrode formed on the quartz substrate comprise Ti, Pt, Au or Cr, Pt, Au.

* * * * *